(12) United States Patent
Nakai et al.

(10) Patent No.: US 7,087,945 B2
(45) Date of Patent: Aug. 8, 2006

(54) PROCESS FOR MANUFACTURING SEMICONDUCTOR DEVICE AND SEMICONDUCTOR DEVICE

(75) Inventors: Junichi Nakai, Fukuyama (JP); Tetsuro Aoki, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/755,019

(22) Filed: Jan. 8, 2004

(65) Prior Publication Data

US 2004/0142501 A1 Jul. 22, 2004

(30) Foreign Application Priority Data

Jan. 17, 2003 (JP) ............... 2003-009947

(51) Int. Cl.
*H01L 31/062* (2006.01)
*H01L 31/113* (2006.01)
(52) U.S. Cl. ...................... 257/294; 257/288
(58) Field of Classification Search ........ 257/288, 257/289, 290, 291, 292, 293, 294, 257, 258, 257/461, 462, 59, 82, 98
See application file for complete search history.

(56) References Cited

U.S. PATENT DOCUMENTS

| 5,371,397 A | * | 12/1994 | Maegawa et al. ........... 257/432 |
| 5,796,154 A | * | 8/1998 | Sano et al. ................. 257/432 |
| 5,877,040 A | * | 3/1999 | Park et al. .................... 438/70 |
| 6,255,640 B1 | * | 7/2001 | Endo et al. ............... 250/208.1 |
| 6,504,188 B1 | * | 1/2003 | Maruyama et al. ......... 257/222 |
| 6,903,395 B1 | * | 6/2005 | Nakai et al. ................ 257/294 |

FOREIGN PATENT DOCUMENTS

| JP | 04-012568 | 1/1992 |
| JP | 11-087672 | 3/1999 |

* cited by examiner

*Primary Examiner*—David Nhu
(74) *Attorney, Agent, or Firm*—George W. Neuner; David G. Conlin; Edwards Angell Palmer & Dodge LLP

(57) ABSTRACT

A process for manufacturing a semiconductor device comprising the steps of: forming a transparent film on a semiconductor substrate including a photoelectric conversion section, the transparent film having a concave portion above the photoelectric conversion section; forming a material film on the transparent film, the material film being made of a photosensitive material having a refractive index higher than that of the transparent film; and irradiating selectively a predetermined portion of the material film with rays, and then developing the material film, whereby forming an intralayer lens having a convex portion facing into the concave portion.

4 Claims, 4 Drawing Sheets

PROCESS FOR MANUFACTURING SEMICONDUCTOR DEVICE AND SEMICONDUCTOR DEVICE

CROSS-REFERENCE TO RELATED APPLICATION

This application is related to Japanese Patent Application No. 2003-009947 filed on Jan. 17, 2003, whose priority is claimed under 35 USC § 119, the disclosure of which is incorporated by reference in its entirety.

BACKGROUND OF THE INVENTION

1. Field of the Invention

The present invention relates to a process for manufacturing a semiconductor device and a semiconductor device formed by the process. More particularly, it relates to a process for manufacturing a semiconductor device comprising a photoelectric conversion section, and a semiconductor device formed by the process.

2. Description of Related Art

Semiconductor image pickup devices such as Charge Coupled Device (CCD) Image sensors, Complementary Metal Oxide Semiconductor (CMOS) Image sensors and the like have been used for various applications such as digital cameras, video cameras, cellular phones with cameras, scanners, digital copiers, facsimiles and the like. As they are widely used, there have been increasing demands for reduction in size and in cost of the devices as well as better functions and performance such as increase of the pixel count and improvement of the light sensitivity of the devices.

Requirements for the reduction in cost of the devices in addition to the reduction in size of the devices and the increase in the pixel count bring about reduction in size of pixels to be incorporated into the devices. The reduction in size of the pixels worsens the light sensitivity of the devices, which is one of the basic requirements for the devices, and makes it difficult to capture clear images in poorly illuminated conditions. Therefore, it is important to improve the light sensitivity of each pixel and manufacture the devices at reduced cost by means of a process suitable for mass production.

As a technique for increasing the light sensitivity of the devices, the following techniques are known. For example, a technique of forming a microlens made of an organic polymeric material on a color filter is disclosed in Japanese Unexamined Patent Publication No. HEI 4(1992)-12568, and another technique of forming a lens inside a laminated structure between a light-receiving section and a color filter, which is so-called an intralayer lens, is disclosed in Japanese Unexamined Patent Publication No. HEI 11(1999)-87672.

As shown in FIG. 3, the solid-state image pickup device including such an intralayer lens comprises a CCD transfer channel 24, a reading gate section 23, a photoelectric conversion section (light-receiving section) 22 and a channel stopper 25 in a surface of a semiconductor substrate 21, and a transfer electrode 27 formed on the CCD transfer channel 24 via an insulating film 26 and a light-shielding film 29 formed on the transfer electrode 27 via an interlayer dielectric 28. The device further comprises a planarizing film 30 made of Boro-Phosphosilicate Glass (BPSG) or the like, an intralayer lens 74, a color filter 12 of R, G or B, a protective film 13 and a microlens 14. These are laminated on the light-shielding film 29 in this order. Here, the microlens 14 is placed above the photoelectric conversion section 22.

A method of forming the intralayer lens will be hereinafter described.

As shown in FIG. 4(a), implantation or the like of required impurities into a semiconductor substrate 21 is performed to form a photoelectric conversion section 22, a reading gate section 23, a CCD transfer channel 24 and a channel stopper 25. Subsequently, an insulating film 26 is formed on a surface of the semiconductor substrate 21, and then a transfer electrode 27 (whose film thickness is, for example, 300 nm) having a predetermined pattern is formed on the insulating film 26. Thereafter, a light-shielding film 29 (whose film thickness is, for example, 200 nm) is formed on the transfer electrode 27 via an interlayer dielectric 28 so that it covers the transfer electrode 27 and has an opening above the photoelectric conversion section 22.

As shown in FIG. 4(b), a BPSG film where each predetermined concentration of phosphorous and boron is predetermined is deposited on the light-shielding film 29 and semiconductor substrate 21 by an atmospheric pressure CVD process so as to have a film thickness of 600 nm, and is subjected to a reflow process at a temperature of 900° C. or higher, thereby to form a planarizing film 30 having a concave portion above the photoelectric conversion section 22. The surface of this concave portion constitutes a convex surface of an intralayer lens to be formed on this film 30.

As shown in FIG. 4(c), a silicon-nitride-series film 71 is formed on the planarizing film 30 by an atmospheric pressure CVD process. The thickness of the silicon-nitride-series film 71 is larger than the depth of the concave portion of the planarizing film 30. Since the concave portion is due to the shape of the light-shielding film 29 on the transfer electrode 27, the depth of the portion is about 500 nm. Thus, the thickness of the silicon-nitride-series film 71 is set to 500 nm or greater, for example, about 1500 nm.

Subsequently, a Spin on Glass (SOG) film precursor is spin-coated onto the silicon-nitride-series film 71 so that the SOG film has a thickness of 1500 nm, and is subjected to an annealing treatment (for example, at 400° C. for 30 hours), thereby to form an SOG film 72 having a flat surface.

As shown in FIG. 4(d), the SOG film 72 and silicon-nitride-series film 71 are etched back so that the SOG film 72 is completely removed and the surface of the silicon-nitride-series film 71 is planarized. In this process, the films above are etched so that a thickness of about 3000 nm in terms of an SOG film is etched. Etching back conditions are set up so that the etching selectivity of the SOG film 72 to the silicon-nitride-series film 71 is from 1.0:0.9 to 1.0:1.1. The above process can be performed by either of a plasma etching method such as a high-frequency parallel plates method, a magnetron high-frequency plasma method, a microwave plasma method or a magnetic field microwave discharge method.

Then, as shown in FIG. 4(e), an intralayer lens 74 formed from the silicon-nitride-series film 71 is formed on the planarizing film 30.

The aforesaid formation method of the intralayer lens has the following problems 1 to 3.

1. The silicon-nitride-series film 71 constituting the intralayer lens needs to be formed so that the thickness of the film 71 becomes larger than the depth of the concave portion of the underlying planarizing film 30. When the silicon-nitride-series film 71 having a thickness of 1000 nm or greater is formed by an atmospheric pressure CVD apparatus or a plasma CVD apparatus which is generally used in the formation of silicon-nitride-series film, the film 71 is plastically deformed by a film stress, and a crack occurs in the film. Furthermore, the film thickness of the film 71 is not likely to be uniform, which leads to nonuniformity of the thickness of the intralayer lens. As a result, the image quality of the solid-state image pickup device is deteriorated.

2. The SOG film 72 needs to be formed to have such a thickness that the concave portion of the underlying. silicon-nitride-series film 71 is filled with the SOG film 72 and the surface of the SOG film 72 becomes flat. When the SOG film 72 having a thickness of 1000 nm or greater is formed by spin-coating the precursor onto the film 71, followed by annealing, the film 72 is cracked and exfoliated by a film stress. The crack and exfoliation causes a defect in the shape of the intralayer lens. The defect is problematic to the image pickup device.

3. The SOG film 72 and silicon-nitride-series film 71 to be etched need to have a total thickness of about 3000 nm for the above-mentioned etching back process, and the etching selectivity of the SOG film 72 to the silicon-nitride-series film 71 needs to be set to about 1:1. The amount of etching is liable to vary in one wafer or wafers. Therefore, it is very difficult to form an intralayer lens having a uniform thickness. Further, etching apparatuses used in this process are expensive, and maintenance comprising control of the etching rate, dust control and the like takes a lot of labor.

SUMMARY OF THE INVENTION

The present invention has been achieved in view of the aforesaid problems. An object of the present invention is to provide a simple process for manufacturing a semiconductor device capable of forming a high-quality intralayer lens having a uniform thickness with no cracking and exfoliating of either the intralayer lens or insulating films formed over and under the lens and without introducing a new apparatus, and a semiconductor device formed by the process.

According to the present invention, there is provided a process for manufacturing a semiconductor device comprising the steps of:

forming a transparent film on a semiconductor substrate including a photoelectric conversion section, the transparent film having a concave portion above the photoelectric conversion section;

forming a material film on the transparent film, the material film being made of a photosensitive material having a refractive index higher than that of the transparent film; and irradiating selectively a predetermined portion of the material film with rays, and then developing the material film, whereby forming an intralayer lens having a convex portion facing the concave portion.

With this process, the intralayer lens having a uniform thickness with no cracking and exfoliating thereof can simply be formed by a spin coater, a developer, an exposure machine and the like which are generally used in semiconductor manufacturing processes, without introducing a new apparatus.

According to another aspect of the present invention, there is provided a semiconductor device comprising: a semiconductor substrate including a photoelectric conversion section; a transparent film formed on the semiconductor substrate, the transparent film having a concave portion above the photoelectric conversion section; and an intralayer lens formed on the transparent film, the intralayer lens having a convex portion facing the concave portion, the intralayer lens being made of a photosensitive material having a refractive index higher than that of the transparent film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
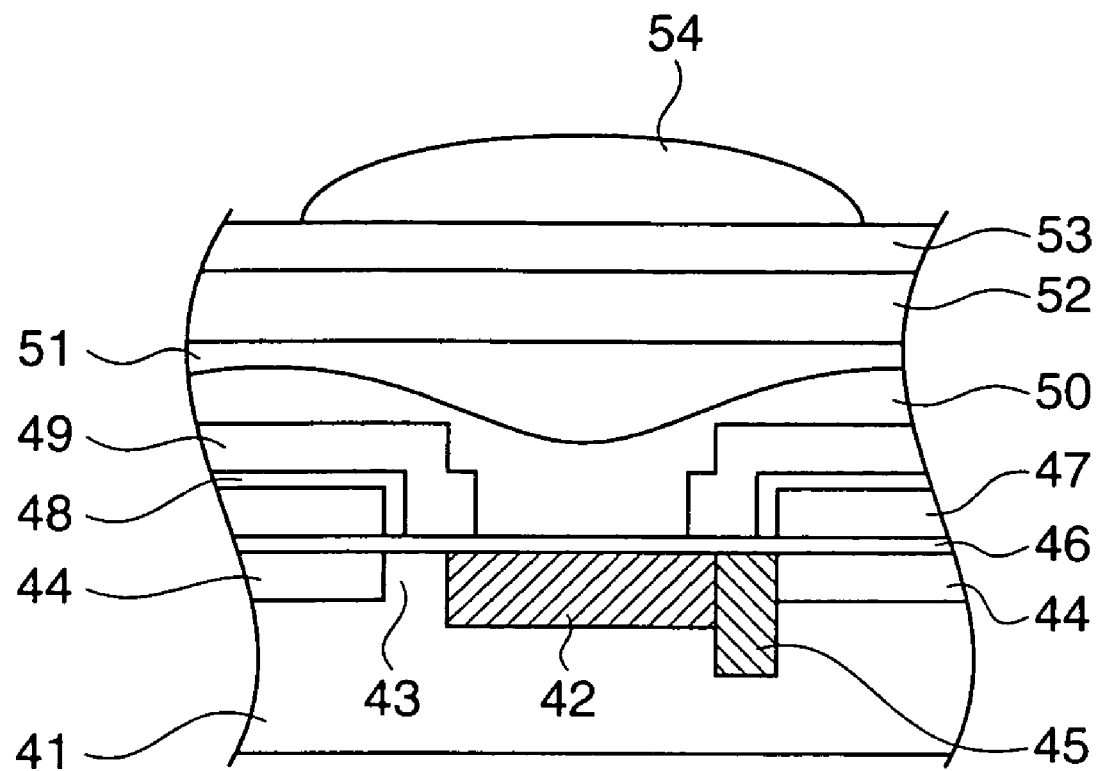
FIG. 1 is a schematic sectional view of a major portion of a semiconductor device according to an embodiment of the present invention.

In a process for manufacturing a semiconductor device according to the present invention, a photoelectric conversion section is first formed in a semiconductor substrate. The semiconductor substrate is not particularly limited as long as it is generally used for producing semiconductor devices. For example, the semiconductor substrate may be made of an elemental semiconductor such as silicon, germanium or the like, or a compound semiconductor such as SiC, GaAs, AlGaAs or the like. Among them, a silicon substrate is preferred. Typically, the semiconductor substrate may be doped with n-type or p-type impurities, and may have one or more n-type or p-type wells. In addition to the photoelectric conversion section (a light-emitting section or a light-receiving section), a region containing high concentration of n-type or p-type impurities may be formed in and/or on a surface of the semiconductor substrate to form a charge transfer region, an isolating region, a contact region, a channel stopper or the like, and other semiconductor devices and circuits may also be formed therein or thereon.

The photoelectric conversion section may comprise a light-receiving section or a light-emitting section. The light-receiving section may be typified by a pn junction diode formed in the surface of the semiconductor substrate. The size, shape and number, and the impurity concentration, and the like of a p-type or n-type impurity layer can be set as appropriate depending on required performance of the semiconductor device to be obtained. The light-emitting section may comprise a light-emitting diode. The photoelectric conversion section in the surface of the semiconductor substrate may be formed by a known process. The process may comprise the steps of; forming a mask having an opening at desired portion by a photolithography and etching process, and ion-implanting through the mask.

In the case of a CCD, a transfer electrode may be formed between adjacent photoelectric conversion sections via an insulating film, and a light-shielding film is formed on the transfer electrode via an interlayer dielectric. The transfer electrode may be made of polycrystalline silicon, tungsten silicide or the like. The thickness of the transfer electrode may be about 300 to 600 nm, for example. The light-shielding film may be made of a material which can block visible light and/or infrared light, for example, tungsten silicide, a metal comprising titanium, tungsten, or the like, or an alloy thereof, and the thickness of the film may be about 100 to 1000 nm. The insulating film or interlayer dielectric may be a mono-layer film which is generally used for such films or dielectrics, such as a plasma Tetra-Ethoxy Silane (TEOS) film, a Low Temperature Oxide (LTO) film, a High Temperature Oxide (HTO) film or a None-Doped Silicate Glass (NSG) film formed by a CVD process, an SOG film formed by a spin coating process, a silicon nitride film formed by a CVD process, or the like, or a laminated film thereof. The total thickness of the insulating film, interlayer dielectric, transfer electrode and light-shielding film is preferably adjusted to about 500 to 2000 nm depending on the thickness and material of a transparent film to be described later, because the above-mentioned insulating film, interlayer dielectric, transfer electrode and light-shielding film may have an influence on the thickness and shape of an intralayer lens to be formed thereon.

The transparent film is formed on the semiconductor substrate so as to have a concave portion above the photoelectric conversion section. The concave portion may be formed due to the shapes of the transfer electrode, the light-shielding film and the like, or may be formed by etching the transparent film. The light transmission of the transparent film may suitably be about 80 to 100% depending on a material to be used and the thickness thereof. The transparent film may be a mono-layer film, which can be either of the insulating films listed above or a laminated film thereof, among which a BPSG film is preferred. The thickness of the transparent film may be about 100 to 2000 nm. It is preferred that the thickness is suitably adjusted because the depth and shape of the concave portion may have an influence on the thickness and shape of a convex portion of an intralayer lens to be formed thereon.

The above-mentioned insulating film, interlayer dielectric, transfer electrode, light-shielding film and transparent film may be formed by processes known in this field to be selected as appropriate. The processes may comprises at least one of a sputtering process, a CVD process, a spin coating process, a vacuum evaporation process, an EB process and the like. The CVD process may be a low pressure CVD process, an atmospheric pressure CVD process, a plasma CVD process or the like.

A photosensitive material film having a refractive index higher than that of the transparent film is formed on the resulting semiconductor substrate. Then, a predetermined portion of the material film is selectively irradiated with rays, and the material film is developed. Whereby an intralayer lens is formed so as to have a convex portion facing the concave portion of the transparent film.

The material film may be made of a resin which can be cured or becomes alkali-soluble by the irradiation with rays. The resin may be positive or negative-type resist known in this field. The rays may be energy rays comprising γ-rays, X-rays, visible rays, ultraviolet rays or the like, among which the ultraviolet rays are preferred. The energy of the rays is not particularly limited, but the energy of the ultraviolet rays may suitably be about 500 to 800 mJ, for example. The material film may be made of an organic material, such as an acrylic-series material, a polyimide-series material or the like. The refractive index of the material film for visible light is preferably about 1.6 or greater. In order to increase the refractive index of the material film, the material film may contain a material whose refractive index is higher than that of the above-mentioned materials, and particularly, whose refractive index is about 2.0 or greater. For example, the material film may contain an inorganic material such as an inorganic oxide, and particularly a zinc oxide, a titanium oxide, a zirconium oxide, a tin oxide or the like. The above materials have preferably a particle size of about 20 nm or less, more preferably a particle size of about 10 nm or less. The mixing ratio between the organic material and the particulate material is suitably set so that factors such as transmission, a refractive index, photosensitive performance, deformation at a reflow process, surface homology and residuals after development can be optimized. For example, the mixing ratio between the organic material and the particulate material may be about 1:0.1 to 0.3, preferably about 1:0.2 to 1.5. Optionally, any photosensitive agent known in this field may further be added to the material film. The material film having a smooth surface can be formed by applying the above-mentioned materials on the transparent film by means of a known process such as a roll coating process, a spray coating process, a lip coating process, a dip coating process, a spin coating process, a bar coating process, a screen coating process or the like, followed by drying. The thickness of the material film can suitably be adjusted in consideration of the transmission of the material to be used. For example, the thickness thereof may be about 500 to 1500 nm.

The material film can be selectively irradiated with rays by a known method such as a method of irradiating the material film with rays through a mask having a suitable pattern, or a method of irradiating only a desired portion of the material film with rays by an electron beam lithography method. Where the material film is made of a material cured by irradiation with rays, only a portion on which the intralayer lens will be formed is selectively irradiated with the rays. Where the material film is made of a material which becomes alkali-soluble by irradiation with rays, a portion comprising a bonding pad and a scribing line, where the intralayer lens will not be formed, is selectively irradiated with the rays.

The material film can be developed by an alkali solution, more particularly, an alkali solution containing a tetramethylammonium hydroxide, ammonia or the like.

The material film within a pixel region, where the photoelectric conversion section, the transfer electrode, the light-shielding film and the like are formed is left, and the material film on the bending pad and scribing line is removed by development. Thus, the intralayer lens with the convex portion, which is due to the concave portion of the transparent film caused by the transfer electrode and the light-shielding film, can be formed within the range of the pixel region and above the photoelectric conversion. The top surface of the intralayer lens may be planarized, and the intralayer lens may have a convex portion on its top surface. The convex portion is formed by a process comprising the steps of; forming this material film only above the photoelectric conversion section into a rectangular shape, and softening and melting the rectangular-shaped material film by means of heat treatment. Thus, one convex portion caused by the concave portion of the transparent film can be provided at the bottom surface of the intralayer lens, and another convex portion caused by deformation by the heat treatment can be provided at the top surface of the intralayer lens. That is, the intralayer lens may have the convex portions on the both surfaces. In the resulting intralayer lens, a difference in thickness between the thickest portion and the thinnest portion may be about 500 to 1000 nm. More particularly, the thickest portion may be about 1000 to 2000 nm and the thinnest portion may be about 0 to 500 nm in thickness.

According to the present invention, a transparent material film having a low refractive index may be formed on the intralayer lens. Compared with the aforesaid material film having a high refractive index, the transparent material film may have a smaller refractive index by 0.5 or greater. The refractive index for visible light of the transparent material film may be about 1.6 or smaller. The transparent material film may be made of a fluoroolefin-series copolymer, a polymer having a fluorine-containing aliphatic ring structure, a perfluoro alkyl ether-series copolymer or a fluorine-contained (meta)acrylate polymer, or a mixture of two or more thereof. Further, fluoride, more particularly, magnesium fluoride may be added to the material film. Fluoride is preferably formed in particles, and each particle size is preferably about 20 nm or less, more preferably about 10 nm or less. The mixing ratio between the fluoroolefin-series copolymer and the particulate material may be about 1:0.1 to 1.5.

With the use of the above-mentioned materials, the material film having a low refractive index can be formed on the intralayer lens by a known process such as a roll coating process, a spray coating process, a lip coating process, a dip coating process, a spin coating process, a bar coating process, a screen coating process or the like. The thickness of the material film can suitably be adjusted in consideration of the material to be used. For example, the thickness thereof may be about 500 to 1500 nm. The material film preferably has a substantially flat surface, that is, the variation of the film thickness among pixels is preferably within several tens of angstrom.

Furthermore, a microlens is preferably formed above the intralayer lens via the transparent material film having a low refractive index. The transparent material film can be formed as a mono-layer film or a laminated film by means of the aforesaid process. Optionally, a functioning film such as a color filter, a passivation film, a protective film, a planarizing film, an interlayer film or the like may be formed on the transparent material film, and two or more functioning films may be laminated on the transparent material film. Each functioning film may be made of any material in any thickness. The microlens can be made of a known material by means of a known process in this field. The bottom surface of the microlens may be flat due to the shape of the underlying layer and the top surface of the microlens is suitably processed to have a convex shape or an arched shape.

The semiconductor device according to the present invention comprises the intralayer lens made of the material having a high refractive index, wherein the intralayer lens is formed on the semiconductor substrate including the photoelectric conversion section, and has the convex portion of the intralayer lens at least on its bottom surface above the photoelectric conversion section. The semiconductor device comprises a solid-state image pickup device such as CCD and CMOS image sensors, a CMD, a charge injection device, a bipolar image sensor, a photoconduction film image sensor, a laminated CCD or an infrared image sensor. Furthermore, the semiconductor device may comprise a light-receiving element or a light-emitting element such as a light-emitting diode which is produced in a process for manufacturing a semiconductor integrated circuit. The semiconductor device can be used as a light-receiving section or a light-emitting section of a device such as a light transmission control device of a liquid crystal panel.

With reference to the attached drawings, the semiconductor device and its manufacturing process of the present invention will hereinafter be described in detail by way of embodiment thereof. The terms for apparatuses and materials used herein are the same as the ones generally used in semiconductor device manufacturing processes. Therefore, a detailed description of the terms is omitted.

As shown in FIG. 1, a CCD solid-state image pickup device of the semiconductor device according to the present invention comprises a CCD transfer channel 44, a reading gate section 43, a photoelectric conversion section 42 and a channel stopper 45 which are formed in a surface of a semiconductor substrate 41, and a transfer electrode 47 formed on the CCD transfer channel 44 via an insulating film 46 and a light-shielding film 49 formed on the transfer electrode 47 via an interlayer dielectrics 48. The light-shielding film 49 is provided for preventing light from leaking into a transfer section. The device further comprises a transparent film 50 made of BPSG, an intralayer lens 51 having a high refractive index, a color filter 52 of R, G or B, a protective film 53 made of a transparent organic film and a microlens 54. These are laminated on the light-shielding film 49 in this order. The intralayer lens 51 is provided so as to form a convex portion above the photoelectric conversion section and the microlens 54 is provided above the photoelectric conversion section 42.

This CCD solid-state image pickup device can be formed by the following process.

Figure 2A:
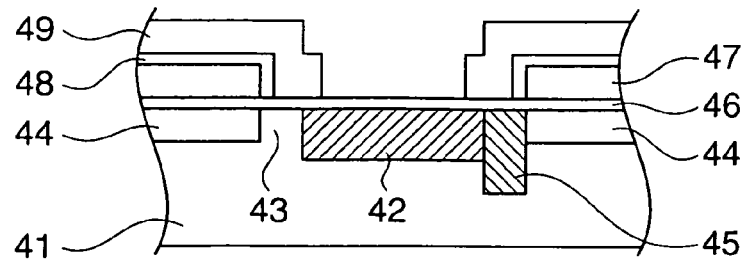
FIGS. 2(a) to 2(c) are schematic sectional views of major portions illustrating steps in the process for manufacturing the semiconductor device of FIG. 1.

As shown in FIG. 2(a), implantation of required impurities is performed into a semiconductor substrate 41, thereby to form a photoelectric conversion section 42, a reading gate section 43, a CCD transfer channel 44 and a channel stopper 45. Subsequently, an insulating film 46 such as a silicon oxide film is formed on a surface of the semiconductor substrate 41 by thermal oxidization or the like, and then a transfer electrode 47 made of polysilicon and having a predetermined pattern is formed on the insulating film 46. Thereafter, a light-shielding film 49 made of tungsten silicide formed on the transfer electrode 47 via an interlayer dielectric 48. The light-shielding film is provided so as to cover the transfer electrode 47 and have an opening above the photoelectric conversion section 42.

Figure 2B:
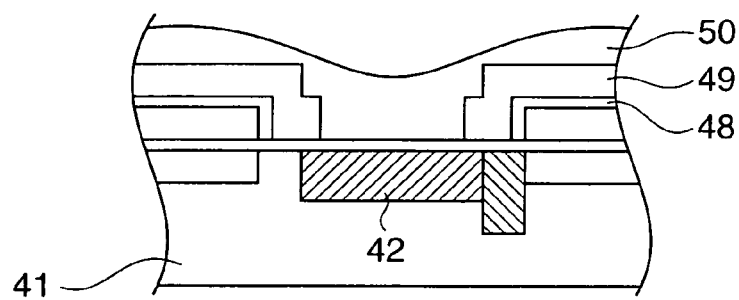

As shown in FIG. 2(b), a BPSG film is deposited on the light-shielding film 49 and semiconductor device 41 by an atmospheric pressure CVD process so that the BPSG film has a film thickness of 900 nm. At this time, each concentration of boron and phosphorous contained in the BPSG film is set so that the BPSG film has a concave portion with a smooth surface formed above the photoelectric conversion section 42. Here, the concentration of boron is set to 3.8 wt % and that of phosphorous is set to 4.2 wt %. Then, the BPSG film is subjected to a reflow process at a temperature of 950° C. for 20 minutes, whereby a transparent film 50 is obtained.

Figure 2C:
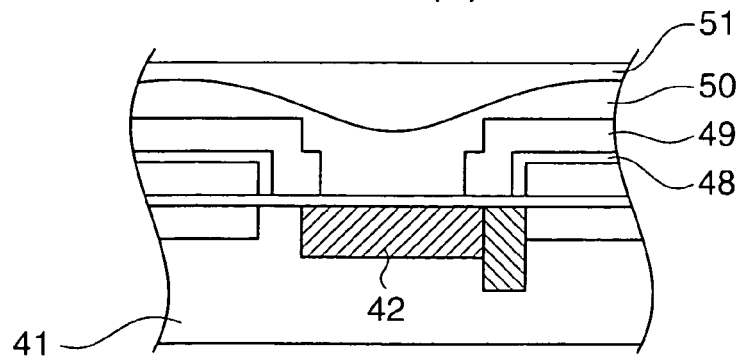
Figure 3:
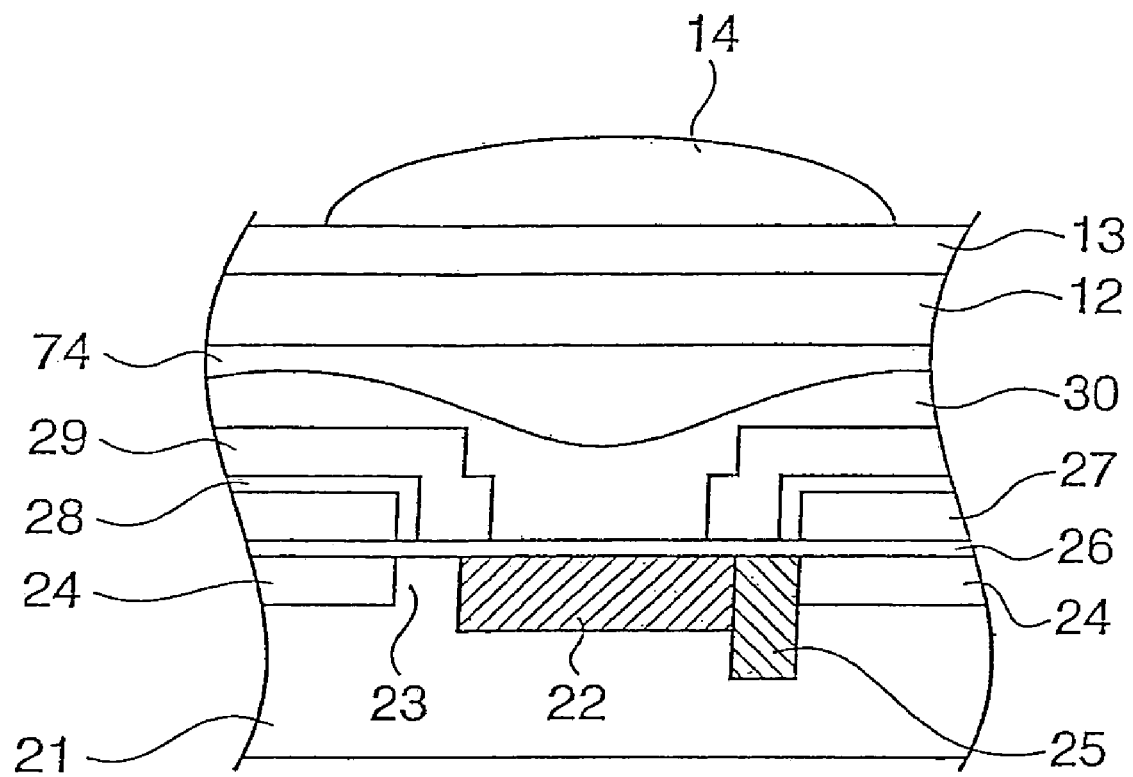
FIG. 3 is a schematic sectional view of a conventional solid-state image pickup device including a intralayer lens.
Figure 4D:
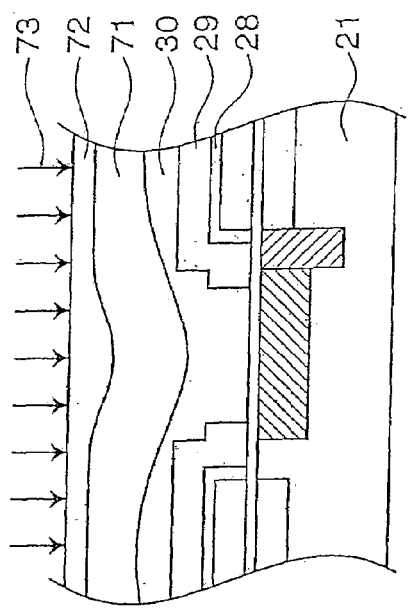
FIGS. 4(a) to 4(e) are schematic sectional views of major portions illustrating steps in the process for forming the intralayer lens of FIG. 3.
Figure 4E:
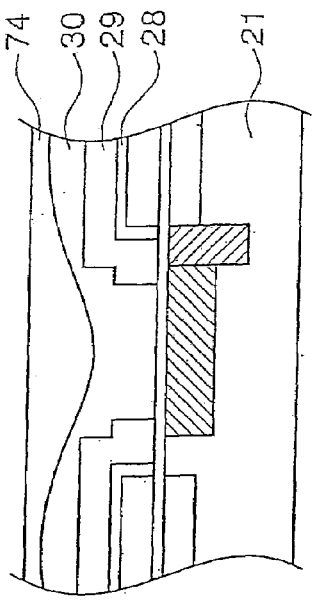
Figure 4A:
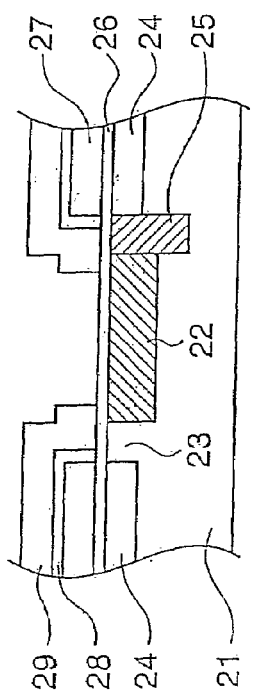
Figure 4B:
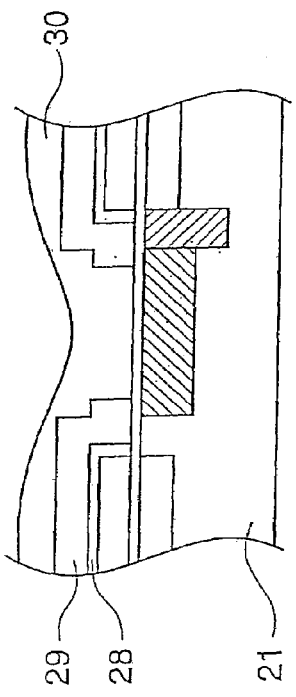
Figure 4C:
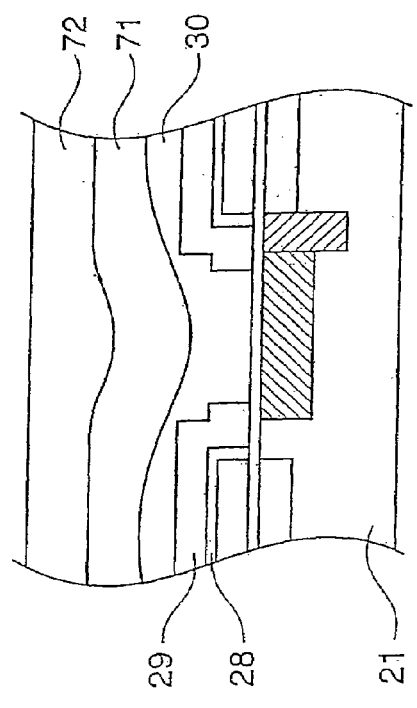

Subsequently, a material having a high refractive index is spin-coated in a thickness of 800 nm onto the obtained transparent film 50, and dried by a hot plate at 90° C. for 2 hours. The above material used herein is an acrylic-series resin with a photosensitive agent, the resin containing about 20 wt % of a particulate zirconium oxide (a size of about 20 nm). Then, a part of the material above the light-receiving section 42 is selectively irradiated with ultraviolet rays, such as rays having a wavelength of 365 nm, for example, about 700 mJ with the use of a photolithography technique generally used in semiconductor manufacturing processes. The irradiated part is cured, and becomes insoluble in an alkali developer to be described later. The material is developed by the alkali developer containing TMAH of 2.3%, cleaned with water and dried by a hot plate at 200° C. for 2 minutes, whereby an intralayer lens 51 having a convex portion above the photoelectric conversion section 42 is obtained as shown in FIG. 2(*c*).

A negative-type resist in which a pigment having spectral characteristics of G, R or B is dispersed is processed into a desired pattern by a photolithography technique, thereby to form a color filter 52. Then, a 0.7-µm thick acrylic resin (an example of a thermosetting acrylic resin is OPTOMER SS-1151 available from JSR Corporation) is applied onto the color filter 52 to form a protective film 53, and then a microlens 54 is formed by the known technique disclosed in Japanese Unexamined Patent Publication No. HEI 4(1992)-12568, for example. Then, the CCD solid-state image pickup device with the intralayer lens shown in FIG. 1 is obtained.

In the aforesaid embodiment, the explanation of the CCD solid-state image pickup device can be applied to that of other devices, for example, another solid-state image pickup devices such as a MOS solid-state image pickup device, a liquid crystal display device and the like. In the same manner as in the above embodiment, a semiconductor device with an intralayer lens having a desired shape can be obtained by adjusting suitably each thickness of an intralayer lens, a planarizing film, a protective film and a microlens, and their formation conditions.

According to the present invention, a specific material film is formed on a transparent film whose top surface has a concave portion, and a desired portion of the material film is selectively irradiated with rays, followed by development of the material film. Whereby, a convex portion of an intralayer lens can be formed at a desired position. Further, the material film can be formed to have a minimum thickness, and functioning films such as insulating films or the like which are provided over and under the material film can be formed to have a minimum thickness, so that it is possible to prevent a crack of the intralayer lens and an exfoliation of the functioning films. Therefore, the intralayer lens having a uniform thickness can be formed in high quality and at low cost.

What is claimed is:

1. A semiconductor device comprising: a semiconductor substrate including a photoelectric conversion section; a transparent film formed on the semiconductor substrate, the transparent film having a concave portion above the photoelectric conversion section; and an intralayer lens formed on the transparent film, the intralayer lens having a convex portion facing the concave portion, the intralayer lens being made of a photosensitive material having a refractive index higher than that of the transparent film.

2. The semiconductor device according to claim 1, wherein the photosensitive material is an ultraviolet curing resin containing a metal oxide.

3. A semiconductor device comprising: a semiconductor substrate including a photoelectric conversion section; a transparent film formed on the semiconductor substrate, the transparent film having a concave portion above the photoelectric conversion section; and an intralayer lens formed on the transparent film, the intralayer lens having a convex portion facing the concave portion, the intralayer lens being made of a photosensitive material having a refractive index higher than that of the transparent film, wherein the photosensitive material is a resin, wherein the resin contains a metal oxide and becomes alkali-soluble by ultraviolet irradiation.

4. The semiconductor device according to claim 2, wherein the metal oxide comprises at least one of a zirconium oxide and a titanium oxide.

* * * * *